Figure 1:
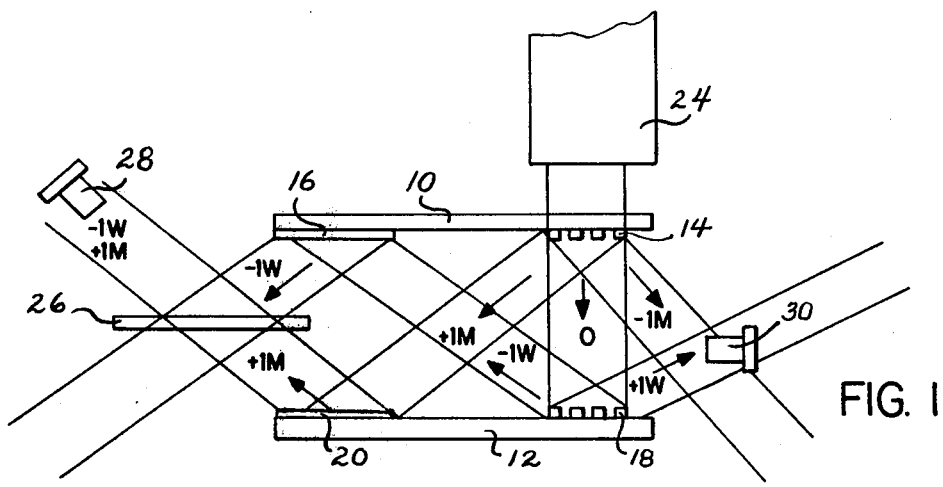

United States Patent [19]

Snow

[11] 4,265,542
[45] May 5, 1981

[54] APPARATUS AND METHOD FOR FINE ALIGNMENT OF A PHOTOMASK TO A SEMICONDUCTOR WAFER

[75] Inventor: Kenneth A. Snow, San Jose, Calif.

[73] Assignee: Computervision Corporation, Bedford, Mass.

[21] Appl. No.: 20,294

[22] Filed: Mar. 14, 1979

Related U.S. Application Data

[63] Continuation of Ser. No. 848,476, Nov. 4, 1977, abandoned.

[51] Int. Cl.³ .............................................. G01B 9/02
[52] U.S. Cl. ...................................... 356/356; 356/363; 356/400
[58] Field of Search ............... 356/150, 356, 395, 399, 356/400, 401, 363; 250/237 G

[56] References Cited

U.S. PATENT DOCUMENTS

| | | | |
|---|---|---|---|
| 3,726,595 | 4/1973 | Matsumoto | 356/356 |
| 3,738,753 | 6/1973 | Huntley | 250/237 G |
| 3,811,779 | 5/1974 | Jacobs et al. | 356/400 |
| 4,051,367 | 9/1977 | Sayce et al. | 356/373 |

FOREIGN PATENT DOCUMENTS 2451994  11/1976  Fed. Rep. of Germany ............ 356/395

*Primary Examiner*—R. A. Rosenberger
*Attorney, Agent, or Firm*—Richard J. Birch

[57] ABSTRACT

A method and apparatus are disclosed for fine aligning a photomask to a semiconductor using the interference and diffraction effects produced by coherent light impinging upon or passing through repetitive patterns on a photomask and a semiconductor. A plurality of photodetectors are employed to convert the interference information into phase dependent electrical signals that are used to control conventional X, Y and θ workpiece positioning mechanisms.

10 Claims, 3 Drawing Figures

APPARATUS AND METHOD FOR FINE ALIGNMENT OF A PHOTOMASK TO A SEMICONDUCTOR WAFER

This is a continuation of application Ser. No. 848,476, filed Nov. 4, 1977, now abandoned.

BACKGROUND OF THE INVENTION

The present invention relates to semiconductor mask-to-wafer alignment techniques and more particularly, to an alignment method and apparatus that utilizes the interference and diffraction effects produced by coherent light impinging upon or passing through repetitive patterns on the mask and wafer.

The sequential processing operations used in the manufacture of semiconductors require accurate alignment of a photomask to the semiconductor wafer. In the early years of semiconductor production, the alignment step was performed manually by using high power microscopes to view the relative alignment of target patterns formed on both the mask and wafer. As the semiconductor industry matured and production capacity increased the alignment operation was automated by means of various electro-optical techniques. At the time, these techniques provided the required degree of alignment accuracy. However, recent advances in the semiconductor industry have produced a significant increase in circuit densities with a concomitant tightening of the allowable alignment tolerances between the mask and the wafer.

It is accordingly a general object of the present invention to provide an improved method and apparatus for fine aligning a photomask and a semiconductor wafer.

It is a specific object of the invention to provide a coherent light alignment method and apparatus that utilizes the interference and diffraction effects produced by coherent light interacting with repetitive alignment patterns on the mask and the semiconductor wafer.

It is still another object of the invention to use the resultant interference information to obtain phase dependent electrical signals for controlling conventional X, Y and $\theta$ positioning mechanisms for the mask and/or wafer.

It is a feature of the invention that this method can be implemented with conventional available mechanical, electrical and optical components.

It is another feature of the invention that the apparatus thereof can be retrofitted to existing automatic mask-to-wafer aligners in order to increase the alignment accuracy of these aligners.

The objects and features of the present invention can best be understood from a detailed description of a preferred embodiment thereof, selected for purposes of illustration and shown in the accompanying drawings, in which:

FIG. 1 is a diagrammatic view in side elevation of a photomask and a semiconductor wafer showing the diffraction orders produced by coherent light illumination of alignment patterns located on the mask and the wafer.

Figure 2:
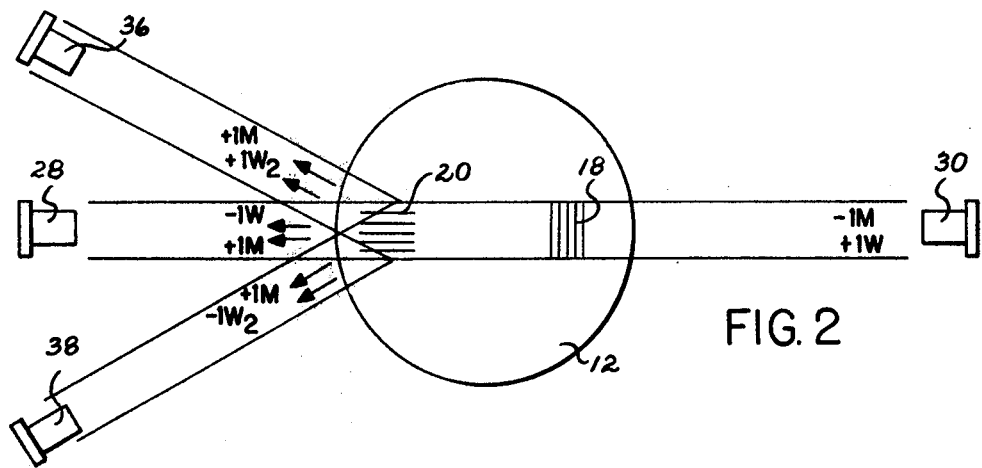
Figure 3:
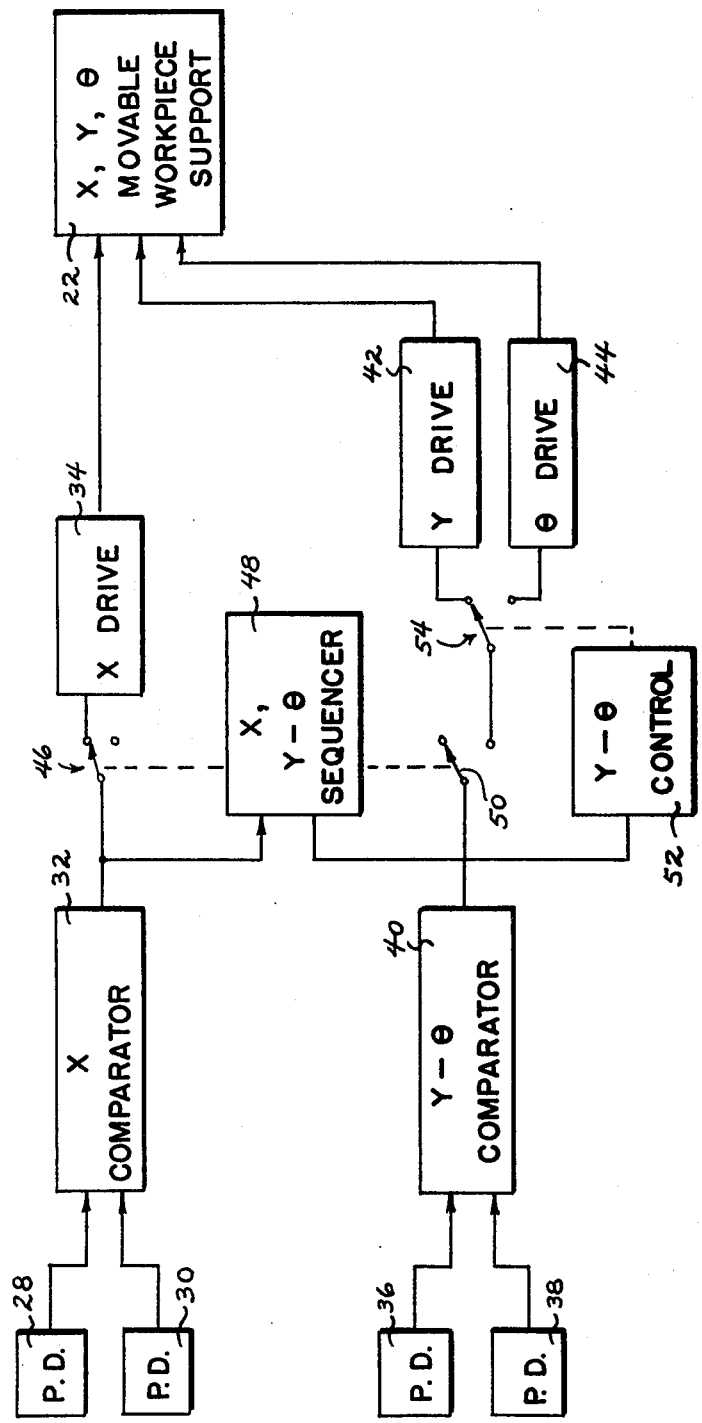

FIG. 2 is a diagrammatic in plan view showing the diffraction orders produced by coherent light illumination of orthogonally disposed alignment patterns on both the mask and semiconductor wafer with the mask removed from the plan view for purposes of clarity; and, FIG. 3 is a block diagram of the circuitry employed to fine align a photomask and a semiconductor wafer using the phase information derived from interference patterns produced by the diffracted orders depicted in FIGS. 1 and 2.

Turning now to the drawings and in particularly to FIG. 1 thereof, there is shown in diagrammatic view in side elevation, a semiconductor photomask 10 positioned in spaced, superimposed relation with respect to a semiconductor wafer 12. The mask 10 has first and second "repetitive" alignment patterns 14 and 16 formed thereon. Corresponding "repetitive" first and second alignment patterns 18 and 20 are located on the semiconductor wafer 12. The term "repetitive", as used herein, includes patterns having a constant frequency as well as patterns having a varying frequency.

The photomask and wafer are supported by and moved relative to each other during the alignment operation by means of a conventional X, Y and $\theta$ drive workpiece support shown in block form in FIG. 3 and identified by the reference numeral 22. The mechanical supports and drive elements have been omitted from the Figures for purposes of clarity. However, since these elements and the entire movable workpiece support 22 e.g., X-Y table and $\theta$ chuck, are so well known no further description is believed necessary in order to understand the invention.

A source of coherent light such as, laser 24, is positioned so that the output beam passes through the mask pattern 14 and impinges upon the wafer pattern 18. Some of the coherent light passing through the mask pattern 14 will be diffracted by the pattern into mask diffracted orders, two of which are shown in FIG. 1 as +1M and −1M. The +1M order is reflected from the second wafer alignment pattern 20 onto a beam divider 26. A portion of the mask diffracted order +1M light passes through the beam divider 26 and strikes a photodetector 28.

The coherent light from laser 24 that is not deviated by mask pattern 14 is identified in FIG. 1 as the 0 diffracted order. This light impinges on the first wafer pattern 18 and produces wafer diffracted orders, two of which are depicted in FIG. 1 and identified as +1W and −1W. The −1W diffracted order from the wafer is reflected from the second mask alignment pattern 16 onto the other side of the interposed beam divider 26. A portion of the reflected −1W light impinging upon the beam divider 26 is reflected by the divider onto photodetector 28.

Given this configuration, it can be seen that the +1M diffracted order from the first mask pattern 14 and the −1W diffracted order from the first wafer pattern 18 will arrive superimposed at photodetector 28. Since the +1M defracted order and the −1W diffracted orders are derived from the same coherent light source 24 and, since the laser 24 is selected so that the mask-to-wafer distance does not exceed the laser's coherence path length, the interference of the two diffracted orders +1M and −1W will occur at the photodetector 28. This interference renders the phase relationship of the two beams +1M and −1W evident. The relative phase information derived from the interference of the +1M and −1W diffracted orders is employed as the criteria for judging the alignment of the mask and wafer patterns.

It can also be seen in FIG. 1 that the −1M diffracted order from mask pattern 14 and the +1W diffracted order from wafer pattern 18 are observed at their intersection by a second photodetector 30 that monitors the relative phase information in the resultant interference pattern.

Photodetectors 28 and 30 produce an electrical output signal having a characteristic that varies as a function of the phase relationship between the diffracted orders (+1M, −1W) and (−1M, +1W), respectively. These electrical signals are used to control the relative movement of the mask 10 and semiconductor 12 as will be explained below in connection with the block diagram shown in FIG. 3.

The use of the beam divider 26 in conjunction with the photodetector 28 and the direct observation of the interference pattern by photodetector 30 illustrate two of a number of possible ways that the interference information can be converted into a phase dependent electrical light. However, regardless of the way that one chooses to arrange the photodetectors, it is desirable to monitor the two interference patterns (−1W, +1M) and (+1W, −1M) in order to eliminate any ambiguity that might arise from a variation in the mask-to-wafer spacing.

Assuming that photodetectors 28 and 30 are positioned along the X axis when the wafer is viewed in plan as shown in FIG. 2, the electrical signal outputs from photodetectors 28 and 30 can be employed in conventional circuitry to provide X-axis alignment of the mask and semiconductor. Referring to FIG. 3, the outputs signals from photodetectors 28 and 30 are applied as inputs to a comparator 32 the output of which represents an error signal for controlling the operation of a conventional X-axis drive 34 for the conventional X, Y and $\theta$ movable workpiece support 32. In a null or balance type system, when both of the interference patterns viewed by photodetectors 28 and 30 have the same gray level, the output signal from comparator 32 terminates the operation of the X-axis drive 34. At this point, X axis alignment of the mask to the wafer has been achieved.

Referring back to FIG. 2, the second wafer pattern 20 is shown disposed orthogonally with respect to the first wafer pattern 18. A similar orthogonal relationship exists between the two mask patterns 14 and 16. The mask and laser have been removed from the illustration for purposes of clarity. The diffractive orders produced by the −1W and +1M orders impinging upon the second mask and wafer patterns 16 and 20, respectively, produce the previously mentioned diffractive orders −1W and +1M in addition to diffractive orders +1M, +W$_2$ and +1M, −W$_2$, as shown in in FIG. 2.

Photodetectors 36 and 38 are positioned off the axis of photodetectors 26 and 28 as viewed in FIG. 2 to extract the phase relationships from diffractive orders +1M, +1W$_2$ and +1M, −1W$_2$, respectively. These phase relationships contain both the Y and $\theta$ alignment information.

Looking at FIG. 3 the outputs from photodetectors 36 and 38 are applied to a comparator 40. The output from comparator 40 is an error signal that represents the Y and $\theta$ misalignment of the mask and wafer. This error signal is sequentially used to control the operation of Y and $\theta$ drives 42 and 44, respectively.

It will be appreciated that manual control of the sequential operation of not only the Y and $\theta$ drives, but also the X drive is possible. However, it is desirable to provide automatic sequencing of these drives in a mask-to-wafer aligner.

The error signal output from the X comparator 32 is applied to the X-drive 34 through a single pole, single throw switch, indicated generally as 46. Control of the switch position is provided by an X, Y-$\theta$ sequencer 48 that receives as inputs, the output error signals from comparators 32 and 40. The sequencer 48 maintains X-drive switch 46 in a closed position until the error signal from comparator 32 reaches a predetermined condition that represents a corresponding phase relationship between the diffracted orders. During the time that the X-drive 34 is operating, the Y and $\theta$ drives are inhibited by means of another SPST switch 50 that is controlled by its sequencer 48. Switch 50 remains open until the error signal from comparator 32 reaches the predetermined condition. At that point, switch 46 is opened thereby disabling the X-drive 34 and switch 50 is closed thereby enabling the Y and $\theta$ drives 42 and 44.

Assuming that switch 50 is closed, the output error signal is fed from comparator 40 to a Y-$\theta$ control 52 that controls the position of a SPDT switch 54. Switch 54 applies the comparator error signal to either the Y or $\theta$ drives depending upon the switch position. The Y-$\theta$ control 52 maintains switch 54 in one position until a predetermined percentage reduction in the error signal from comparator 40 is achieved and then the switch is moved to the other position. This process is repeated until the Y-$\theta$ error signal reaches a predetermined condition. The alignment operation can terminate at this point or the whole sequence can be repeated by feeding the Y-$\theta$ error signal to sequencer 48. Sequencer 48 then opens switch 50 and closes switch 46 to further correct the X alignment.

In the preceding discussion it was assumed that a more crude prealignment occurred before the application of the method of the present invention. Such realignment can be achieved through a variety of techniques including direct visual alignment via a microscope, two adjacent patterns at each site with slightly different frequencies in conjunction with a dual wavelength laser, or slight frequency modulation if the patterns to produce slightly divergent diffracted orders that can be used to eliminate the ambiguity encountered in the course alignment step.

Having described in detail a preferred embodiment of my invention it will be appreciated that numerous modifications can be made therein without departing from the scope of the invention as defined in the appended claims. For example, although the hardware implementation of the method shown in FIG. 3 depicts the comparison of the phase relationships between two interference patterns as detected by photodetectors such as, photodetectors 28 and 30, the required alignment information can be extracted from a single interference pattern, albeit with some loss of sensitivity. In addition, rather that using a null balancing configuration, the mask and wafer can be aligned to produce a predetermined phase relationship and then moved a known distance in X, Y and/or $\theta$ to achieve final alignment.

What I claim and desire to secure by Letters Patent of the United States is:

1. A method for aligning a mask having first and second repetitive alignment patterns to a semiconductor wafer having corresponding first and second repetitive alignment patterns, said method comprising the steps of:
(1) initially positioning the mask in superposed, spaced relation to the wafer with at least a portion of each of said first and second mask alignment patterns overlying at least a portion of the corresponding first and second wafer alignment patterns;
(2) illuminating the first mask alignment pattern with coherent light from a source of coherent light to produce first and second mask diffracted orders;
(3) reflecting said first mask diffracted order from the second wafer alignment pattern;
(4) illuminating the first wafer alignment pattern with coherent light from said coherent light source to produce first and second wafer diffracted orders;
(5) reflecting said first wafer diffracted order from the second mask alignment pattern;
(6) combining said reflected mask and wafer first diffracted orders to produce an interference;
(7) extracting the phase relationship of said reflected first diffracted orders from said interference;
(8) combining said mask and wafer second diffracted orders to produce another interference;
(9) extracting the phase relationship of said second diffracted orders from said other interference;
(10) relatively moving said mask and wafer to produce a predetermined relationship with respect to the two extracted phase relationships.

2. The method of claim 1 wherein said reflected mask and wafer diffracted orders are combined by impinging said orders on opposite sides of a beam divider.

3. The method of claim 1 wherein said coherent light source is a laser and wherein said mask and wafer are positioned in spaced relation at a distance equal to or less than the laser's coherent path length.

4. A method for aligning a mask having first and second repetitive alignment patterns to a semiconductor wafer having corresponding first and second repetitive alignment patterns, said method comprising the steps of:
(1) initially positioning the mask in superposed, spaced relation to the wafer with at least a portion of each of said first and second mask alignment patterns overlying at least a portion of the corresponding first and second wafer alignment patterns;
(2) illuminating the first mask alignment pattern with coherent light from a source of coherent light to produce first and second mask diffracted orders, $+1M$ and $-1M$, respectively;
(3) reflecting said first mask diffracted order $+1M$ from the second wafer alignment patterns;
(4) illuminating the first wafer alignment patterns with coherent light from said coherent light source to produce first and second wafer diffracted orders $+1W$ and $-1W$, respectively;
(5) reflecting said second wafer diffracted order $-1W$ from the second mask alignment pattern;
(6) combining said reflected mask and wafer diffracted orders $+1M$ and $-1W$ to produce an interference;
(7) extracting the phase relationship of the $+1M$ and $-1W$ diffracted orders from said interference;
(8) combining said mask and wafer diffracted orders $-1M$ and $+1W$ to produce another interference;
(9) extracting the phase relationship of said diffracted orders $-1M$ and $+1W$ from said another interference;
relatively moving said mask and wafer to produce a predetermined relationship with respect to the two extracted phase relationships.

5. The method of claim 4 wherein:
(1) the phase relation of diffracted orders $+1M$ and $-1W$ is extracted from the interference by positioning a first photodetector to intercept said interference, said first photodetector generating an electrical signal having a characteristic that varies as a function of the phase relationship of said diffracted orders $+1M$ and $-1W$ at said interference;
(2) the phase relationship of the diffracted orders $-1M$ and $+1W$ is extracted from said another interference by positioning a second photodetector to intercept said another interference, said second photodetector generating an electrical signal having a characteristic that varies as a function of the phase relationship of said diffracted orders $-1M$ and $+1W$ at said another interference; and,
(3) the electrical signals from said first and second photodetectors are compared to generate an error signal that is used to control the relative movement of said mask and wafer, said mask and wafer being moved relatively to produce a predetermined condition for the error signal.

6. An apparatus for aligning a mask having first and second repetitive alignment patterns to a semiconductor wafer having corresponding first and second repetitive alignment patterns, said apparatus comprising:
(1) means for initially positioning the mask in superposed, spaced relation to the wafer with at least a portion of each of said first and second mask alignment patterns overlying at least a portion of the corresponding first and second wafer alignment patterns;
(2) coherent light source means for illuminating: (a) the first mask alignment to produce first and second mask diffracted orders with said first mask diffracted order being reflected from the second wafer alignment pattern; and, (b) the first wafer alignment pattern to produce first and second wafer diffracted orders with said first wafer diffracted order being reflected from the second mask alignment pattern; said reflected first mask and wafer diffracted orders intersecting each order to produce an interference and, said second mask and wafer diffracted orders intersecting each other to produce another interference;
(3) means for extracting the phase relationship of said reflected first mask and wafer diffracted orders from said interference;
(4) means for extracting the phase relationship of said second mask and wafer diffracted orders from said another interference; and,
(5) means for relatively moving said mask and wafer to produce a predetermined relationship with respect to the two extracted phase relationships.

7. An apparatus for aligning a mask having first and second repetitive alignment patterns to a semiconductor wafer having corresponding first and second repetitive alignment patterns, said apparatus comprising:
(1) means for initially positioning the mask in superposed, spaced relation to the wafer with at least a portion of each of said first and second mask alignment patterns overlying at least a portion of the corresponding first and second wafer alignment patterns;
(2) coherent light source means for illuminating: (a) the first mask alignment pattern to produce a mask diffracted order that is reflected from the second wafer alignment pattern; and (b) the first wafer alignment to produce a wafer diffracted order that is reflected from the second mask alignment pattern;

(3) means for combining said reflected mask and wafer diffracted orders to produce an interference;

(4) means for extracting the phase relationship of said reflected diffracted orders from said interference; and, (5) means for relatively moving said mask and wafer to produce a predetermined relationship between said reflected diffracted orders.

8. The apparatus of claim 7 wherein: (a) said phase relationship extraction means comprises photodetector means positioned to intercept said interference, said photodetector means generating an electricl signal having a characteristic that varies as a function of the phase relationship of said diffracted orders at said interference, and (b) said means for relatively moving said mask and wafer is responsive to said electrical signal with said mask and wafer being moved relatively to produce a predetermined condition for the electrical signal characteristic.

9. The apparatus of claim 7 wherein said coherent light source means is a laser and wherein said mask and wafer are positioned in spaced relation at a distance equal to or less than the laser's coherent path length.

10. The apparatus of claim 7 wherein said means for combining the reflected mask and wafer diffracted orders comprise a beam divider positioned so that said orders impinge on opposite sides of the beam divider.

* * * * *